(12) United States Patent
Mirzaei et al.

(10) Patent No.: US 8,761,300 B2
(45) Date of Patent: *Jun. 24, 2014

(54) PEAK DETECTOR WITH EXTENDED RANGE

(71) Applicant: Broadcom Corporation, Irvine, CA (US)

(72) Inventors: Ahmad Mirzaei, San Diego, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/688,678

(22) Filed: Nov. 29, 2012

(65) Prior Publication Data

US 2013/0090075 A1 Apr. 11, 2013

Related U.S. Application Data

(63) Continuation of application No. 12/804,319, filed on Jul. 19, 2010, now Pat. No. 8,325,848.

(51) Int. Cl.
  *H04L 27/00* (2006.01)
(52) U.S. Cl.
  USPC ............... 375/295; 375/259; 327/58; 327/62; 327/63; 327/72; 327/77
(58) Field of Classification Search
  USPC .............. 375/257–259, 295, 296; 327/58–65, 327/72–73, 108, 337, 537; 326/82–83
  See application file for complete search history.

(56) References Cited

U.S. PATENT DOCUMENTS

| 5,185,581 | A  | * | 2/1993  | Brown          | 330/254 |
|-----------|----|---|---------|----------------|---------|
| 6,064,262 | A  | * | 5/2000  | Wang           | 330/253 |
| 6,232,842 | B1 | * | 5/2001  | Asano          | 330/308 |
| 7,382,166 | B1 | * | 6/2008  | Ide            | 327/62  |
| 7,525,347 | B1 | * | 4/2009  | Luo            | 327/58  |
| 7,626,777 | B2 | * | 12/2009 | Aemireddy et al. | 360/25 |
| 8,026,743 | B2 | * | 9/2011  | Ou             | 327/62  |
| 2007/0070534 | A1 | * | 3/2007 | Aemireddy et al. | 360/25 |
| 2010/0099369 | A1 | * | 4/2010 | Ozgun et al.   | 455/125 |

FOREIGN PATENT DOCUMENTS

JP             601145722       *   8/1985

\* cited by examiner

*Primary Examiner* — Jean B Corrielus
(74) *Attorney, Agent, or Firm* — Oblon, Spivak, McClelland, Maier & Neustadt, L.L.P.

(57) ABSTRACT

According to one embodiment, a peak detector having extended dynamic range comprises a first differential output coupled to a supply voltage of the peak detector by a first load and coupled to ground by first and second switching devices, and a second differential output coupled to the supply voltage by a second load and coupled to ground by third and fourth switching devices. The control terminals of the first, second, third, and fourth switching devices receive a common bias voltage, and the respective first and second control terminals are configured as differential inputs of the peak detector. In some embodiments, corresponding first power terminals of the first and second switching devices share a first common node further shared by the first differential output, and corresponding first power terminals of the third and fourth switching devices share a second common node further shared by the second differential output.

20 Claims, 6 Drawing Sheets

PEAK DETECTOR WITH EXTENDED RANGE

This is a continuation of application Ser. No. 12/804,319 filed Jul. 19, 2010, now U.S. Pat. No. 8,325,848.

BACKGROUND OF THE INVENTION

1. Field of the Invention

The present invention is generally in the field of electronic circuits and systems. More specifically, the present invention is in the field of communications circuits and systems.

2. Background Art

Transceivers are typically used in communications systems to support transmission and reception of communications signals through a common antenna, for example at radio frequency (RF) in a cellular telephone or other mobile communication device. A transmitter routinely implemented in such a transceiver in the conventional art may utilize several processing stages to condition and preamplify a transmit signal prior to passing the transmit signal to a power amplifier (PA). In many applications, it may be advantageous to adjust the transmit power level of the PA in order to conserve power, and a peak detector may be implemented to help enable that process. For example, the transmitter may adjust, e.g., reduce, its transmit power according to the peak value of a communication signal as measured by its peak detection circuit.

A peak detector implemented in a transmitter is typically designed to provide a direct-current (DC) output corresponding to the peak value of a modulated and preamplified transmit signal provided as an input signal to the peak detector. Conventional peak detectors normally provide no additional amplification, and in practice may attenuate the input signal. Moreover, conventional peak detectors are well known to suffer the dual drawbacks of low sensitivity and low dynamic range. At best, conventional peak detectors provide a DC output approaching the peak value of their input signals, but that may occur only for input signals having an optimized frequency range. Consequently, conventional peak detectors may not reliably provide accurate information about transmit signal strength and thereby frustrate power conservation objectives, which may be particularly undesirable when the transceiver is implemented in a mobile communication device powered by a battery.

Thus, there is a need to overcome the drawbacks and deficiencies in the art by providing a peak detector having an extended dynamic range, suitable for implementation as part of a more modern mobile device transceiver.

SUMMARY OF THE INVENTION

The present invention is directed to a peak detector having extended dynamic range, substantially as shown in and/or described in connection with at least one of the figures, and as set forth more completely in the claims.

DETAILED DESCRIPTION OF THE INVENTION

The present invention is directed to a peak detector having extended dynamic range. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention, which use the principles of the present invention are not specifically described in the present application and are not specifically illustrated by the present drawings.

Figure 1:
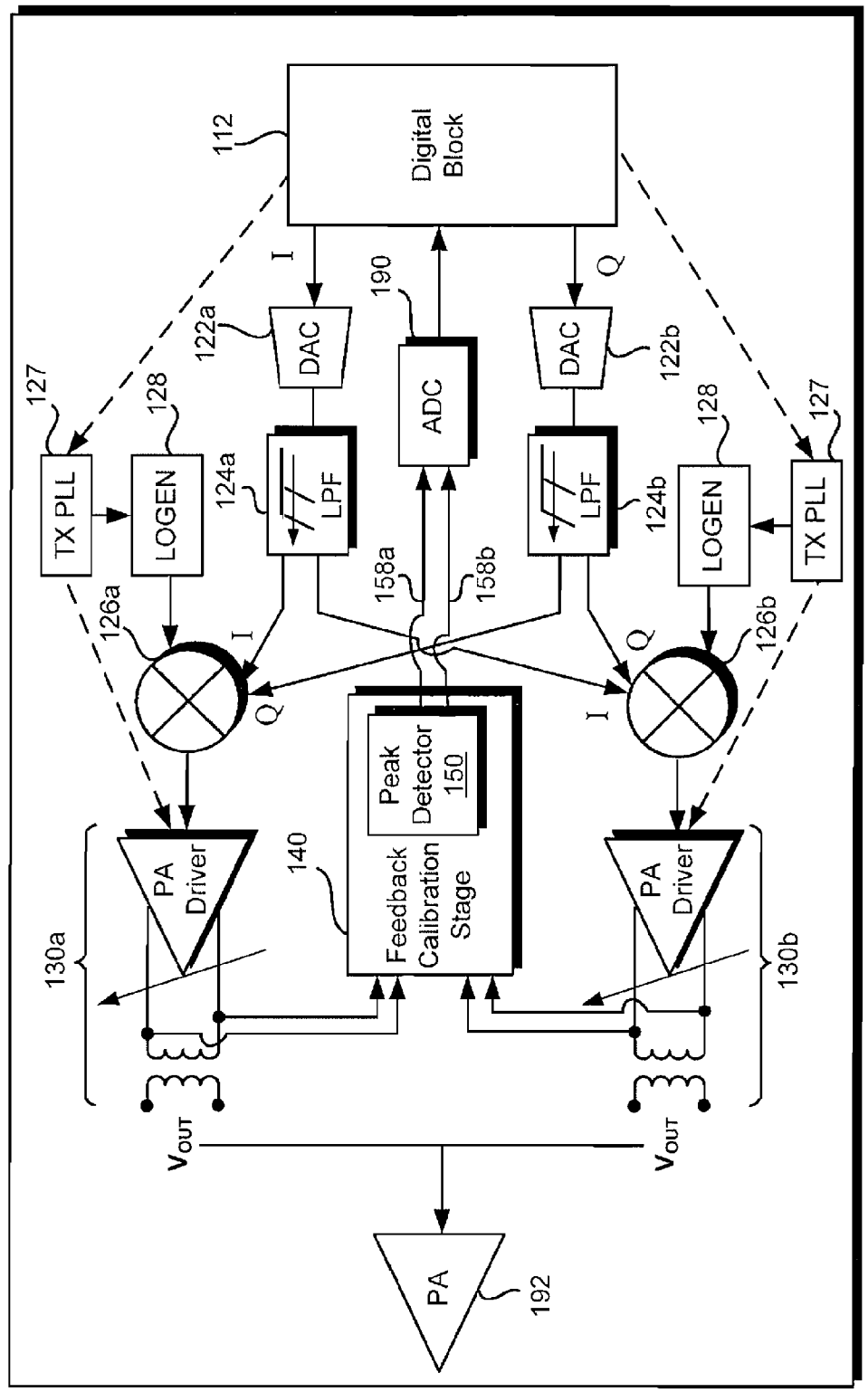
FIG. 1 is a block diagram of a transmitter including a peak detector having extended dynamic range, according to one embodiment of the present invention.

FIG. 1 shows a block diagram of transmitter 100 including peak detector 150 having extended dynamic range, according to one embodiment of the present invention, capable of overcoming the disadvantages associated with conventional designs. As may be seen from FIG. 1, transmitter 100 may be configured to support multiple transmission modes and/or multiple transmission frequencies. For example, transmitter 100 can be configured to support high-band transmission frequencies in a range between approximately 1.8 GHz and 2.2 GHz, as well as low-band transmission frequencies ranging between approximately 0.8 GHz and 1.1 GHz. It is noted that the implementational arrangement shown in FIG. 1, as well as the circuits represented by FIGS. 2A, 2C, 3, and 4 of the present application are for the purpose of assisting in the understanding of and conveying various concepts of the present invention. Elements shown in those figures are representations of physical and electrical elements used in implementing various embodiments of the present invention.

As shown in FIG. 1, transmitter 100 includes power amplifier (PA) 192, which can be coupled to an antenna utilized by transmitter 100 (antenna not shown in FIG. 1). As further shown in FIG. 1, transmitter 100 includes a front-end comprising digital block 112 providing in-phase (I) and quadrature phase (Q) output signals to respective digital-to-analog converters (DACs) 122a and 122b. In addition, and as also shown in FIG. 1, transmitter 100 includes adjustable low-pass filters (adjustable LPFs) 124a and 124b. To support high-band frequency channels as well as low-band frequency channels, transmitter 100 includes respective high-hand mixer 126a and low-band mixer 126b, which may be implemented as passive circuits, for example. In addition, transmitter 100 includes high-band variable gain control PA driver 130a and low-band variable gain control PA driver 130b providing a preamplified transmit signal to PA 192.

Also shown in FIG. 1 are transmitter phase-locked loop (TX PLL) 127 and local oscillator generator (LOGEN) 128, as well as feedback calibration stage 140 including peak detector 150 having extended dynamic range, and analog-to-digital converter (ADC) 190 providing digital calibration feedback to digital block 112. Although TX PLL 127 and LOGEN 128 are shown in duplicate in FIG. 1 for the purposes of illustrative clarity, in practice, a single combination of TX PLL 127 and LOGEN 128 can be coupled to both variable gain control PA drivers 130*a* and 130*b*, and can be shared by respective high-band and low-band mixers 126*a* and 126*b* as well.

As mentioned above, the embodiment of FIG. 1 may be implemented to support multiple transmission modes, such as transmission modes employing quadrature modulation schemes and transmission modes employing polar modulation, for example. For instance, in FIG. 1, transmission modes employing quadrature modulation can be associated with the solid line signal paths linking I and Q outputs of digital block 112 to variable gain control PA drivers 130*a* and 130*b* through respective DAC/adjustable LPF/mixer combinations 122*ab*/124*ab*/126*a* and 122*ab*/124*ab*/126*b*. Analogously, transmission modes employing polar modulation can be associated with the dashed line signal paths linking digital block 112 to variable gain control PA drivers 130*a* and 130*b* through TX PLL 127.

It is noted that although the pre-PA signal paths shown in FIG. 1 are represented by single lines for simplicity, many of those signals can comprise paired differential signals. Thus, the I and Q outputs of digital block 112 passed to mixers 126*a* and 126*b*, the outputs of mixers 126*a* and 126*b*, the polar mode outputs of digital block 112 passed to variable gain control PA drivers 130*a* and 130*b* through TX PLL 127, and the feedback calibration signal returned to digital block 112 by ADC 190, for example, can comprise differential signals. It is further noted that the signal paths internal to variable gain control PA drivers 130*a* and 130*b*, as well as the feedback signals provided by those variable gain control PA drivers to feedback calibration stage 140 and the outputs 158*a* and 158*b* of peak detector 150 having extended dynamic range, are explicitly shown as differential signals.

As further shown in FIG. 1, the I and Q signal paths provided by respective DACs 122*a* and 122*b* and adjustable LPFs 124*a* and 124*b* can be shared between the high-band and low-band transmission signals. Moreover, digital block 112, TX PLL 127, LOGEN 128, feedback calibration stage 140 including peak detector 150 having extended dynamic range, ADC 190, and PA 192 may be shared in common by all transmission modes and all transmission frequency bands. Consequently, transmitter 100 is characterized by a compact space saving architecture that may be particularly well suited to meet increasingly fine dimensional and lower power consumption constraints as fabrication technologies transition to the 40 nm node, for example, and beyond.

Transmitter 100 may be implemented as part of a communications transceiver, for example, utilized in a cellular telephone or other mobile communication device operating at RF, such as in a frequency range from approximately 0.8 GHz to approximately 2.2 GHz. Moreover, in one embodiment, transmitter 100 can be implemented as part of a transceiver integrated circuit (IC) fabricated on a single semiconductor die using a 40 nm process technology, for example.

Turning now to FIGS. 2A, 2C, 3, and 4, those figures show respective peak detectors 250A, 250C, 350, and 450 having extended dynamic range, according to various embodiments of the present invention. Each of peak detectors 250A, 250C, 350, and 450 shown in respective FIGS. 2A, 2C, 3, and 4, can correspond to peak detector 150, in FIG. 1. However, it is noted that while the innovative extended dynamic range peak detector of the present invention, and its related concepts, can be advantageously implemented in an RF transmitter, such as transmitter 100, in FIG. 1, the present peak detector having extended dynamic range may be used in any RF component or device, including but not limited to transmitters. For example, the example peak detectors having extended dynamic range disclosed by the present application can be used in an RF receiver, an RF transceiver, or any other RF device, and is not necessarily limited to an RF transmitter. Thus, transmitter 100 is used as a specific example of any "RF device" in the present application.

Peak detectors 250A, 250C, 350, and 450 are configured to overcome the deficiencies of conventional designs which typically exhibit low sensitivity, limited dynamic range, and are prone to attenuating an input signal. The present inventors have realized that by harnessing the non-linear response characteristics displayed by some semiconductor switching devices, their novel and inventive solution succeeds in providing an approach to peak detection characterized by improved sensitivity, extended dynamic range, and positive signal gain, all of which represent significant advantages over the conventional art.

Figure 2A:
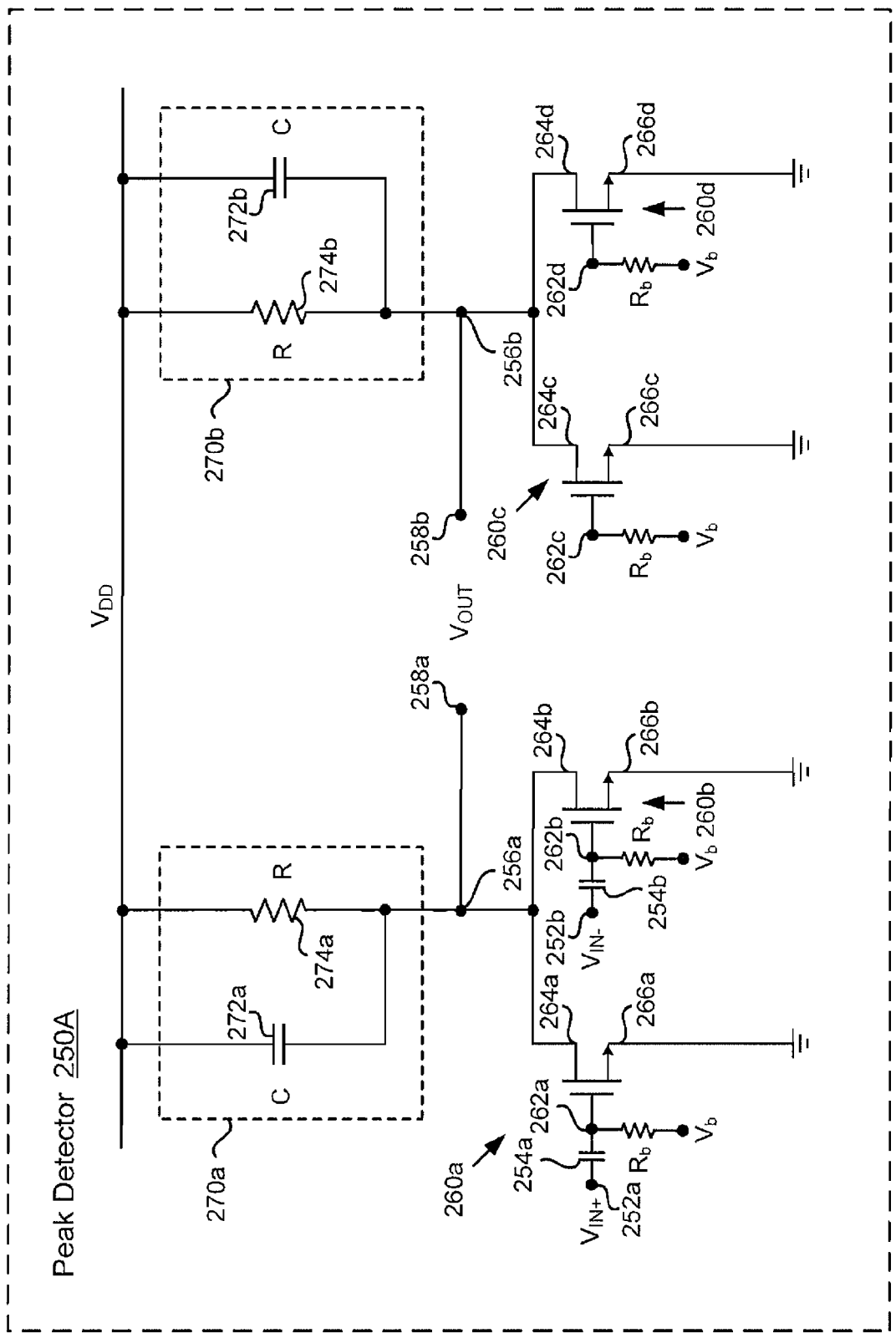
FIG. 2A, is a block diagram showing elements of a peak detector circuit having extended dynamic range, according to one embodiment of the present invention.
Figure 2B:
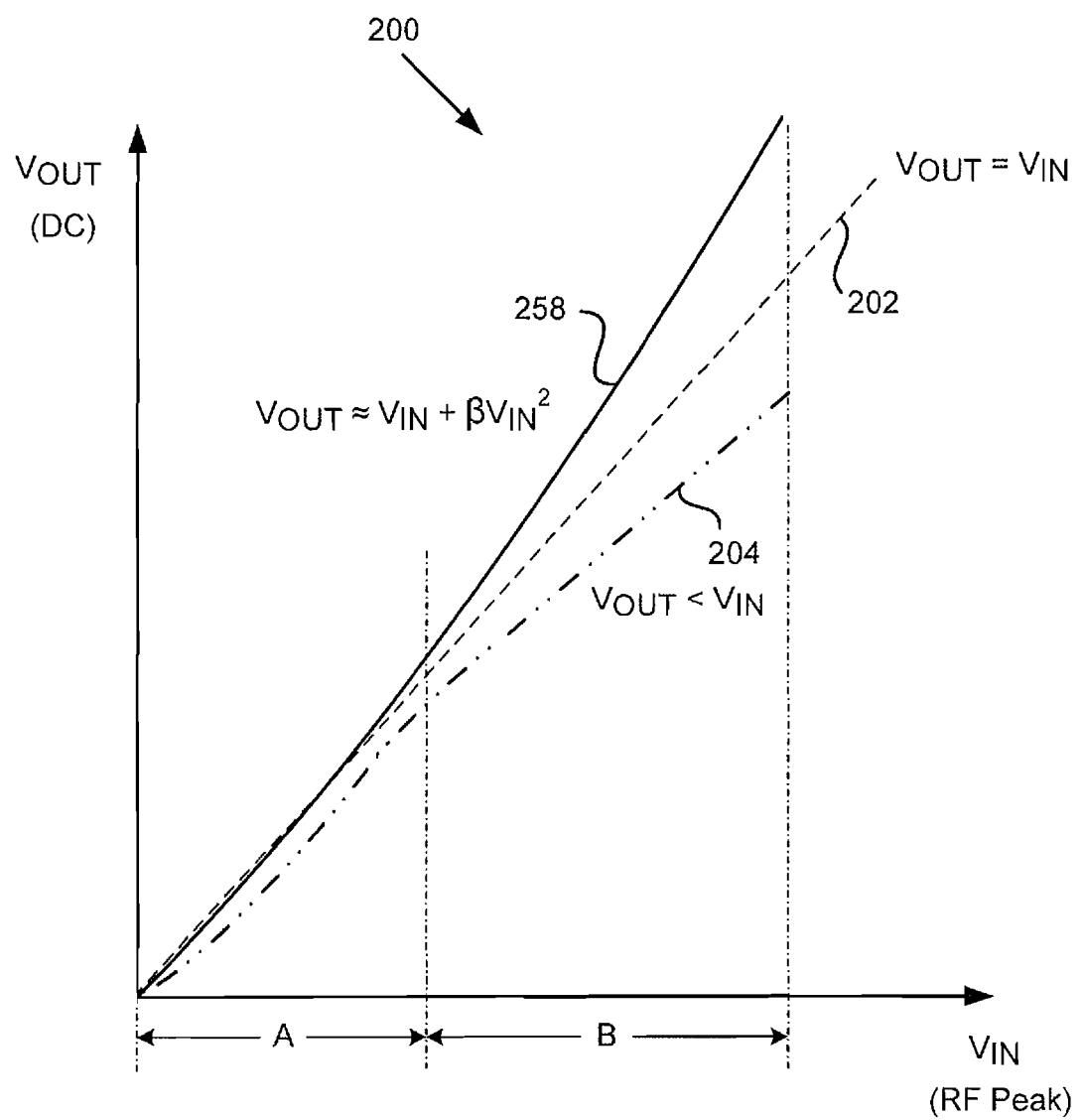
FIG. 2B, is a graph contrasting the positive gain achievable through implementation of one or more embodiments of the present invention, with the less than unity gain typically provided by conventional peak detectors.

Referring first to FIGS. 2A and 2B, FIG. 2A shows peak detector 250A having extended dynamic range, according to one embodiment of the present invention, while FIG. 2B is a graph contrasting the positive gain achievable through implementation of one or more embodiments of the present invention, with the less than unity gain typically provided by conventional peak detectors. As shown in FIG. 2A, peak detector 250A comprises differential output 258*a* coupled to supply voltage $V_{DD}$ of peak detector 250A by load 270*a* and node 256*a*, and coupled to ground by switching devices 260*a* and 260*b*, also through node 256*a*, which is a node shared in common by differential output 258*a* and corresponding power terminals 264*a* and 264*b* of respective switching devices 260*a* and 260*b*. In addition, peak detector 250A comprises differential output 258*b* coupled to supply voltage $V_{DD}$ of peak detector 250A by load 270*b* and node 256*b*, and coupled to ground by switching devices 260*c* and 260*d*, also through node 256*b*, which is a node shared in common by differential output 258*b* and corresponding power terminals 264*c* and 264*d* of respective switching devices 260*c* and 260*d*. FIG. 2A also shows the output of peak detector 250A as $V_{OUT}$, which may be taken across differential outputs 258*a* and 258*b*.

According to the embodiment of peak detector 250A, switching devices 260*a*, 260*b*, 260*c*, and 260*d* (hereinafter "switching devices 260*a*-260*d*"), which may be nominally identical devices, for example, can comprise n-channel field-effect transistors (NFETs). For example, switching devices 260*a*-260*d* may comprise metal-insulator-semiconductor FETs (MISFETs), such as metal-oxide-semiconductor (MOSFETs), as represented in FIG. 2A. Where, as in the embodiment of peak detector 250A, switching devices 260*a*-260*d* comprise NMOS devices, corresponding power terminals 264*a*, 264*b*, 264*c*, and 264*d* (hereinafter "power terminals 264*a*-264*d*") can be seen to comprise corresponding drain terminals of NMOS switching devices 260*a*-260*d*. Also shown in FIG. 2A are power terminals 266*a*, 266*b*, 266*c*, and 266*d* (hereinafter "power terminals 266*a*-266*d*"), which for NMOS switching devices 260*a*-260*d* may be characterized as their corresponding respective source terminals, for example.

Switching devices 260*a*-260*d* of peak detector 250A also include respective control terminals 262*a*, 262*b*, 262*c*, and 262*d* (hereinafter "control terminals 262*a* 262*d*"), e.g., respective gate terminals. As shown in FIG. 2A, control terminals 262*a*-262*d* each receive a common bias voltage $V_b$ through biasing resistor $R_b$. In addition, control terminals 262a and 262b are capacitively coupled to respective differential inputs 252a and 252b of peak detector 250A through respective input capacitors 254a and 254b. As further shown by FIG. 2A, according to the embodiment of peak detector 250A, differential input 252a receives positive differential voltage signal $V_{IN+}$ and differential input 252b receives negative differential voltage signal $V_{IN-}$, although the polarity of those differential input signals can be reversed in the present embodiment.

Loads 270a and 270b are shown to comprise passive loads in the present embodiment. Loads 270a and 270b comprise parallel arrangements of respective capacitor and resistor pairs 272a/274a and 272b/274b. As may be understood from the arrangement shown in FIG. 2A, in operation, switching devices 260a and 260b, and load 270a serve as input devices and an input load for peak detector 250A, while switching devices 260c and 260d, and load 270b provide replica circuit elements for those input components.

FIG. 2B shows a graph of the direct-current (DC) $V_{OUT}$ as a function of peak input voltage $V_{IN}$ and contrasts the performance of peak detector 250A with the typical performance seen from conventional peak detection circuits. Dashed line 202 represents the exemplary case of unity gain, where the DC output of a peak detector matches the peak voltage input without attenuation or positive gain. As shown by conventional peak detector output line 204, typical conventional designs impose some attenuation, so that the effective output from conventional peak detectors is less than the actual peak input voltage. By contrast, the embodiment of peak detector 250A harnesses the second order voltage amplification produced by, for example, by NMOS switching devices 260a-260d, which do not cancel as a result of differential signal processing, to provide output voltage 258 that is enhanced by a factor proportional to the square of peak input voltage $V_{IN}$.

Such a contrast is highlighted by the graph shown in FIG. 2B, which shows the DC output in two areas of interests, region "A" and region "B". Region A corresponds to a very low RF input to the peak detector. In that input range, both the conventional peak detector and embodiments of the present invention can be expected to produce a parabolic response curve, e.g., the output voltage is proportional to the square of the peak input voltage for low RF inputs. However, as the peak RF input value rises, as shown in region "B", the performance of conventional peak detector circuits yields a more closely linear response, while embodiments of the present invention continue to produce a response that is enhanced by a factor proportional to the square of the peak input voltage.

It is noted that beyond region "B", the conventional peak detector design will encounter a saturation region in which the response curve will approach flatness (saturation region not shown in FIG. 2B). Analogously, beyond region "B", e.g., in the saturation region of the conventional peak detector, the response curve of embodiments of the present invention will become compressed. Nevertheless, for substantially all peak input RF signal values consistent with normal transmitter operation, embodiments of the present invention enable a peak detector output greater than may be achieved by a conventional peak detector receiving a substantially similar peak voltage input, thereby providing greater sensitivity and extended dynamic range. Moreover, in some implementations, as shown by FIG. 2B, a peak detector designed according to the present inventive concepts can produce a positive gain, i.e., a gain of greater than approximately 1.0.

Figure 2C:
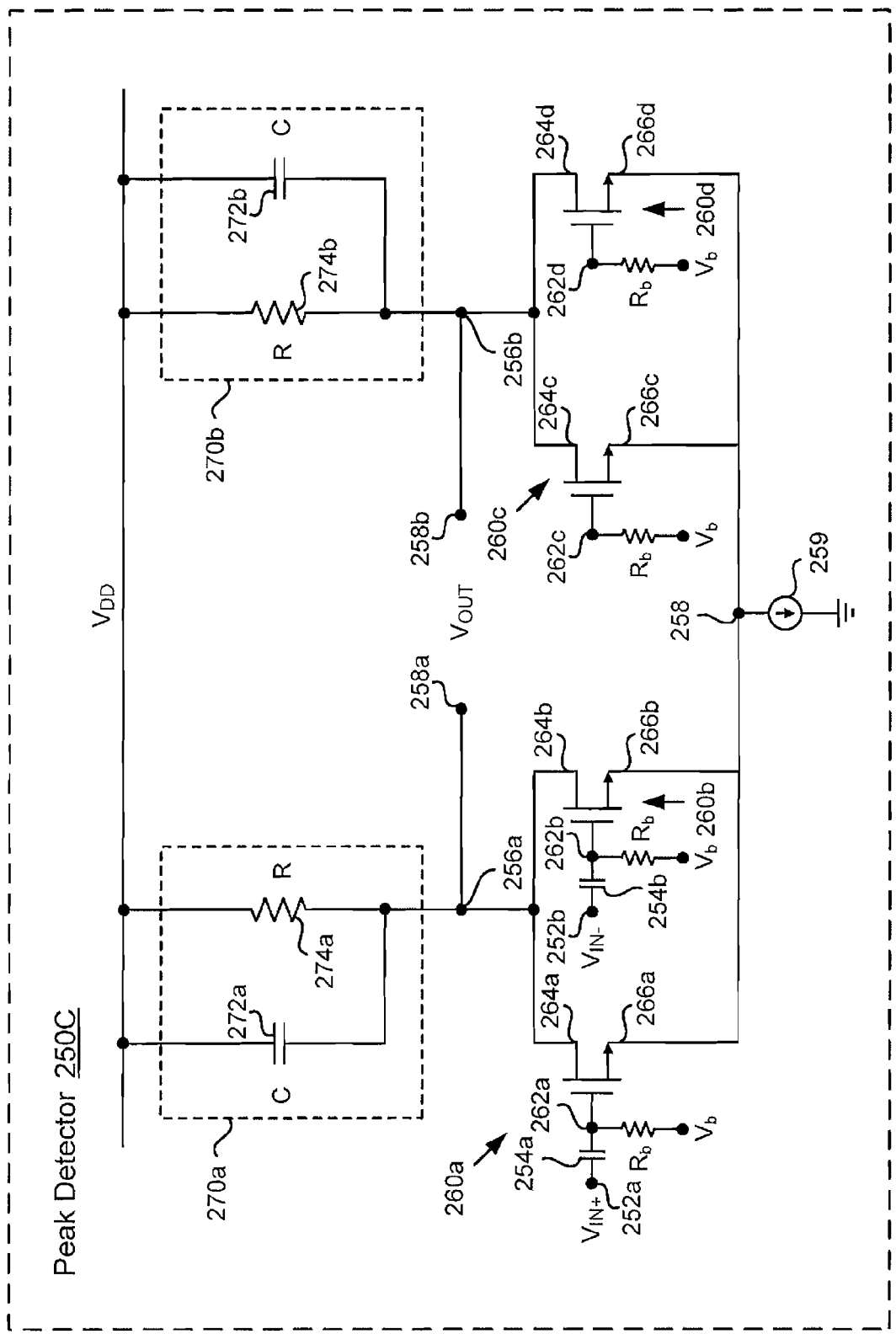
FIG. 2C, is a block diagram showing elements of a peak detector circuit having to extended dynamic range, according to a second embodiment of the present invention.

Moving to FIG. 2C, FIG. 2C shows peak detector 250C having extended dynamic range, according to a second embodiment of the present invention. Circuit elements common to both peak detectors 250C and peak detector 250A, in FIG. 2A, and sharing the same reference numbers, may be seen to correspond respectively to one another. Comparison of the two figures reveals that unlike peak detector 250A, wherein corresponding power terminals 266a-266d of switching devices 260a-260d, e.g., source terminals, are tied directly to ground, in the embodiment of FIG. 2C, corresponding power terminals 266a-266d share node 258 in common, and are collectively coupled to ground through node 258 and tail current source 259. The presence of current source 259, as shown in FIG. 2C, generates a large impedance, thereby improving the common mode rejection ratio by providing peak detector 250C with greater immunity to ground noise.

Figure 3:
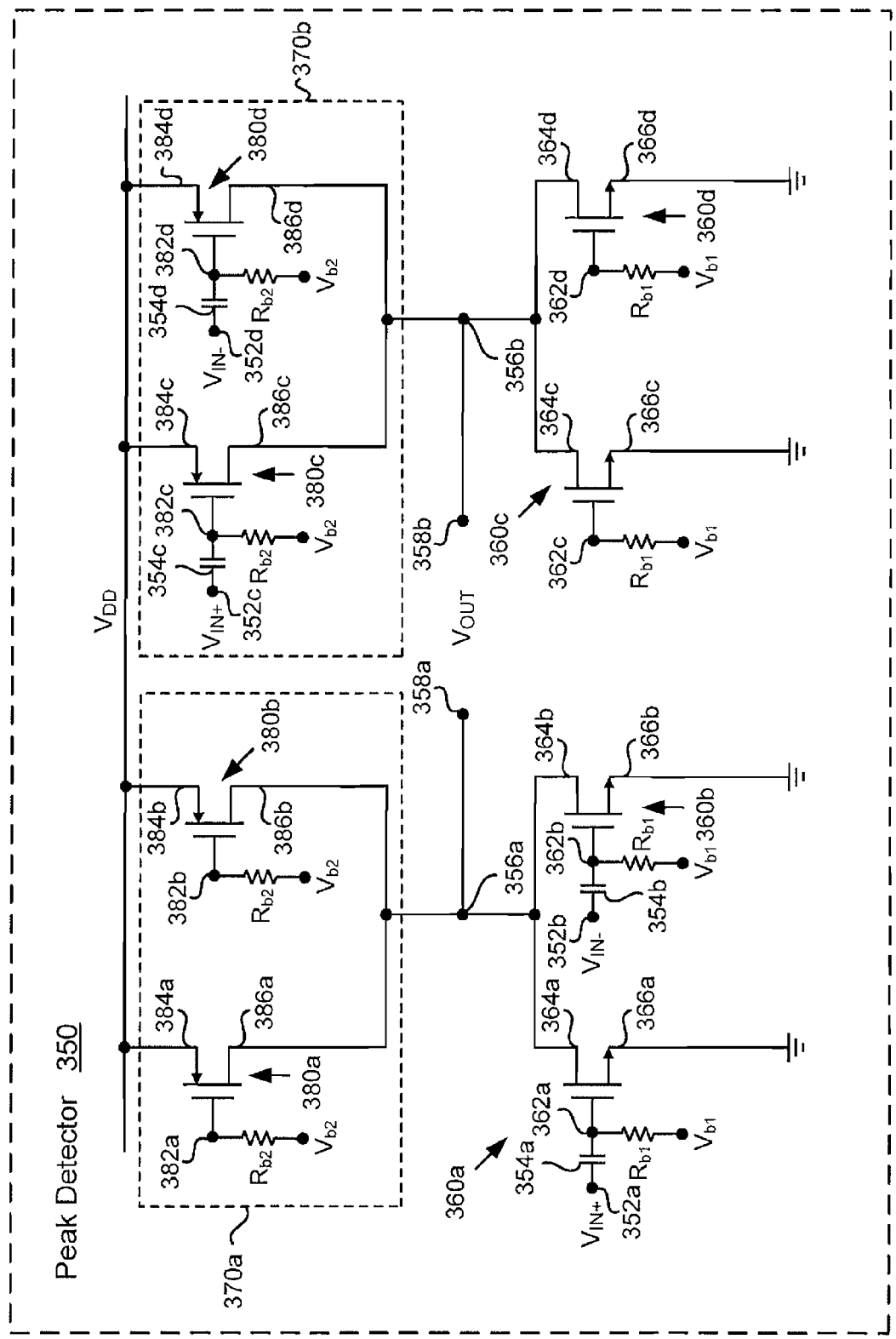
FIG. 3 is a block diagram showing elements of a peak detector circuit having extended dynamic range, according to a third embodiment of the present invention.

Continuing to FIG. 3, FIG. 3 shows peak detector 350 having extended dynamic range, according to a third embodiment of the present invention. Peak detector 350 includes differential outputs 358a and 358b, nodes 356a and 356b, and switching devices 360a-360d including control terminals 362a-362d and power terminals 364a-364d and 366a-366d, corresponding respectively to differential outputs 258a and 258b, nodes 256a and 256b, and switching devices 260a-260d including control terminals 262a-262d and power terminals 264a-264d and 266a-266d, in FIGS. 2A and 2C. It is noted that although the embodiment of FIG. 3 shows power terminals 366a-366d, e.g., NMOS sources, directly tied to ground, as in the embodiment of FIG. 2A, in other embodiments power terminals 366a-366d may collectively couple to ground through a common node and a tail current source, as shown by peak detector 250C, in FIG. 2C, for example.

Peak detector 350, in FIG. 3, also includes differential inputs 352a and 352b capacitively coupled to respective control terminals 362a and 362b by respective input capacitors 354a and 354b, corresponding to the arrangement shown for differential inputs 252a and 252b, in FIGS. 2A and 2C. It is noted that bias voltage $V_{b1}$ and biasing resistors $R_{b1}$, in FIG. 3, correspond respectively to bias voltage $V_b$ and biasing resistors $R_b$, in FIGS. 2A and 2C. Unlike the embodiments of those previous figures, however, which comprised passive loads 270a and 270b, the embodiment of FIG. 3 includes active loads 370a and 370b coupling respective differential outputs 358a and 358b to supply voltage $V_{DD}$ through respective nodes 356a and 356b. Moreover, active load 370b is independently driven by the differential input signals to peak detector 350.

As shown in FIG. 3, load 370a comprises switching devices (also referred to simply as "devices" in the present application) 380a and 380b coupling differential output 358a to $V_{DD}$ through node 356a, which is a node shared in common by differential output 358a, corresponding power terminals 364a and 364b of respective switching devices 360a and 360b, and corresponding power terminals 386a and 386b of respective switching devices 380a and 380b. Load 370b comprises switching devices (also referred to simply as "devices" in the present application) 380c and 380d coupling differential output 358b to $V_{DD}$ through node 356b, which is a node shared in common by differential output 358b, corresponding power terminals 364c and 364d of respective switching devices 360c and 360d, and corresponding power terminals 386c and 386d of respective switching devices 380c and 380d.

According to the embodiment of peak detector 350, switching devices 380a, 380b, 380c, and 380d (hereinafter "switching devices 380a-380d"), which may be nominally identical devices, for example, can comprise p-channel FEV (PFETs). For example, switching devices 380a-380d may comprise PMOS devices, as represented in FIG. 3. Where, as in the embodiment of peak detector 350, switching devices 380a-380d comprise PMOS devices, corresponding power terminals 384a, 384b, 384c, and 384d (hereinafter "power terminals 384a-384d") can be seen to comprise corresponding source terminals of PMOS switching devices 380a-380d. Also shown in FIG. 3 are power terminals 386a, 386b, 386c, and 386d (hereinafter "power terminals 386a-386d"), which for PMOS switching devices 380a-380d may be characterized as their corresponding respective drain terminals, for example.

Switching devices 380a-380d of peak detector 350 also include respective control terminals 382a, 382b, 382c, and 382d (hereinafter "control terminals 382a-382d"), e.g., respective gate terminals. As shown in FIG. 3, control terminals 382a-382d each receive a common bias voltage $V_{b2}$ through biasing resistor $R_{b2}$. In addition, control terminals 382c and 382d are capacitively coupled to respective differential inputs 352c and 352d of peak detector 350 through respective input capacitors 354c and 354d. As further shown by FIG. 3, according to the embodiment of peak detector 350, differential inputs 352a and 352c receive positive differential voltage signal $V_{IN+}$ and differential inputs 352b and 352d receive negative differential voltage signal $V_{IN-}$.

As is true for peak detectors 250A and 250C, shown in respective FIGS. 2A and 2C, the embodiment shown in FIG. 3 harnesses the second order amplification characteristics of transistor switching devices. However, the additional, and inverted, second order amplification produced by PMOS switching devices 380c and 380d, when differentially combined with the second order effects produced by NMOS switching devices 360a and 360d, can result in peak detector 350 having still greater sensitivity, greater dynamic range, and being capable of producing more positive gain than even the embodiments disclosed by previous FIGS. 2A and 2C of the present application.

Figure 4:
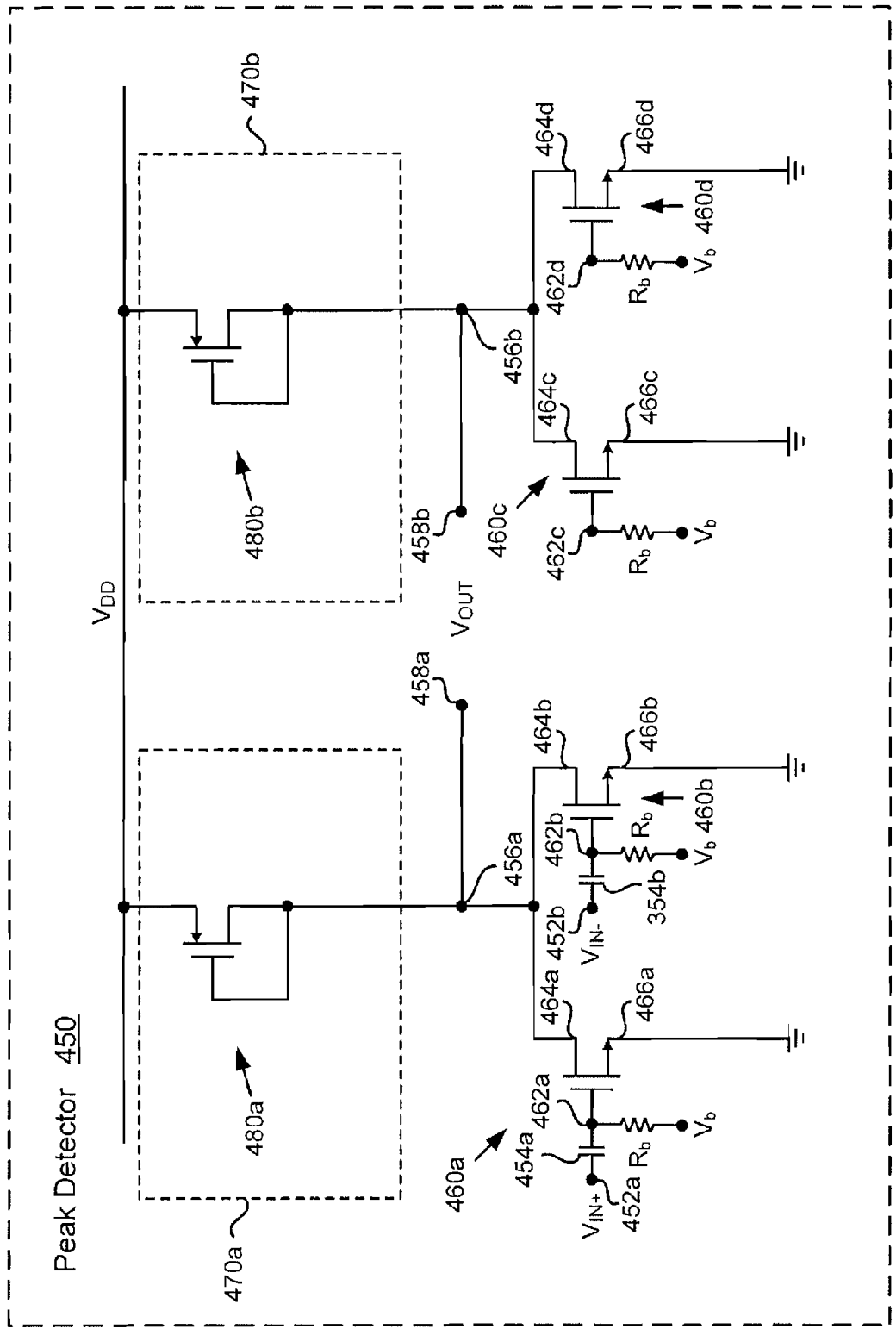
FIG. 4 is a block diagram showing elements of a peak detector circuit having extended dynamic range, according to a fourth embodiment of the present invention.

Referring finally to FIG. 4, FIG. 4 shows peak detector 450 having extended dynamic range, according to a fourth embodiment of the present invention. Peak detector 450 includes differential outputs 458a and 458b, nodes 456a and 456b, and switching devices 460a-460d including control terminals 462a-462d and power terminals 464a-464d and 466a-466d, corresponding respectively to differential outputs 258a and 258b, nodes 256a and 256b, and switching devices 260a-260d including control terminals 262a-262d and power terminals 264a-264d and 266a-266d, in FIGS. 2A and 2C. It is noted that although the embodiment of FIG. 4 shows power terminals 466a-466d, e.g., NMOS sources, directly tied to ground, as in the embodiment of FIG. 2A, in other embodiments power terminals 466a-466d may collectively couple to ground through a common node and a tail current source, as shown by peak detector 250C, in FIG. 2C, for example.

Peak detector 450, in FIG. 4, also includes differential inputs 452a and 452b capacitively coupled to respective control terminals 462a and 462b by respective input capacitors 454a and 454b, corresponding to the arrangement shown for differential inputs 252a and 252b, in FIGS. 2A and 2C. Unlike the embodiments shown by any previous figure, however, loads 470a and 470b comprise respective PMOS diodes 480a and 480b coupling respective differential outputs 458a and 458b to supply voltage $V_{DD}$. In addition to having an extended dynamic range, as do peak detectors 250A, 250C, and 350, shown in respective FIGS. 2A, 2C, and 3, the presence of diodes 480a and 480b in peak detector 450 result in peak detector 450 providing a linear output as $V_{OUT}$.

Thus, by describing a peak detector designed to harness the second order amplification effects produced by semiconductor switching devices, the present application discloses a peak detector having high sensitivity, extended dynamic range, and capable of producing positive gain. Moreover, by describing numerous implementational variations directed to increasing ground noise immunity, further enhancing sensitivity and dynamic range, further increasing available gain, and producing a linear output, the present application discloses a highly flexible and customizable approach to providing a peak detector having extended dynamic range.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A peak detector comprising:
   a first differential output coupled to a supply voltage of said peak detector by a first load and coupled to ground by first and second switching devices;
   a second differential output coupled to said supply voltage by a second load and coupled to ground by third and fourth switching devices;
   wherein respective control terminals of said first, second, third, and fourth switching devices receive a common bias voltage;
   wherein said respective control terminals of said first and second switching devices are coupled to a first differential input and a second differential input.

2. The peak detector of claim 1, wherein said peak detector produces a gain of greater than approximately 1.0.

3. The peak detector of claim 1, wherein said first, second, third, and fourth switching devices comprise metal-insulator-semiconductor field-effect transistors (MISFETs).

4. The peak detector of claim 1, wherein power terminals of said first and second switching devices share a first common node further shared by said first differential output.

5. The peak detector of claim 4, wherein power terminals of said third and fourth switching devices share a second common node further shared by said second differential output.

6. The peak detector of claim 1, wherein said first load comprises at least one active load.

7. The peak detector of claim 6, wherein said first and second switching devices comprise n-channel devices and said at least one active load comprises a p-channel device.

8. The peak detector of claim 1, wherein said second load comprises at least one active load.

9. The peak detector of claim 8, wherein said third and fourth switching devices comprise n-channel devices and said at least one active load comprises a p-channel device.

10. The peak detector of claim 1, wherein said first load comprises a diode coupling said first differential output to said supply voltage.

11. The peak detector of claim 1, wherein said second load comprises a diode coupling said second differential output to said supply voltage.

12. The peak detector of claim 1, wherein said peak detector is a part of a radio frequency (RF) transmitter in a mobile communication device.

13. A peak detector for use in a radio frequency (RF) transmitter, said peak detector comprising:

a first differential output coupled to a supply voltage of said peak detector by a first load and coupled to ground by first and second switching devices;

a second differential output coupled to said supply voltage by a second load and coupled to ground by third and fourth switching devices;

wherein respective control terminals of said first and second switching devices are configured as differential inputs for a transmit signal of said RF transmitter.

14. The peak detector of claim 13, wherein said peak detector produces a gain of greater than approximately 1.0.

15. The peak detector of claim 13, wherein power terminals of said first and second switching devices share a first common node further shared by said first differential output.

16. The peak detector of claim 15, wherein power terminals of said third and fourth switching devices share a second common node further shared by said second differential output.

17. The peak detector of claim 13, wherein said first load comprises at least one active load.

18. The peak detector of claim 17, wherein said first and second switching devices comprise n-channel devices and said at least one active load comprises a p-channel device.

19. The peak detector of claim 13, wherein said second load comprises at least one active load.

20. The peak detector of claim 19, wherein said third and fourth switching devices comprise n-channel devices and said at least one active load comprises a p-channel device.

* * * * *